US009525945B2

(12) United States Patent
Magrath et al.

(10) Patent No.: US 9,525,945 B2
(45) Date of Patent: Dec. 20, 2016

(54) LOUDSPEAKER PROTECTION SYSTEMS AND METHODS

(71) Applicant: Cirrus Logic International (UK) Limited, Edinburgh (GB)

(72) Inventors: Anthony Magrath, Edinburgh (GB); Roberto Napoli, Edinburgh (GB)

(73) Assignee: Cirrus Logic, Inc., Austin, TX (US)

( * ) Notice: Subject to any disclaimer, the term of this patent is extended or adjusted under 35 U.S.C. 154(b) by 35 days.

(21) Appl. No.: 14/602,685

(22) Filed: Jan. 22, 2015

(65) Prior Publication Data

US 2015/0215704 A1 Jul. 30, 2015

(30) Foreign Application Priority Data

Jan. 24, 2014 (GB) .................................. 1401210.8

(51) Int. Cl.
*H03G 11/00* (2006.01)
*H04R 9/02* (2006.01)
*H04R 3/00* (2006.01)
*H04R 29/00* (2006.01)

(52) U.S. Cl.
CPC ............. *H04R 9/022* (2013.01); *H04R 3/007* (2013.01); *H04R 29/003* (2013.01); *H04R 2430/01* (2013.01)

(58) Field of Classification Search
None
See application file for complete search history.

(56) References Cited

U.S. PATENT DOCUMENTS

2002/0118841 A1* 8/2002 Button ..................... H04R 3/00 381/55
2004/0086140 A1* 5/2004 Fedigan ................... H04R 3/00 381/96
2006/0078151 A1* 4/2006 Kemmerer ............ H04R 9/022 381/397
2013/0077796 A1 3/2013 Risbo et al.
(Continued)

FOREIGN PATENT DOCUMENTS

EP 2 538 555 A1 12/2012
WO WO 2004/082322 A2 9/2004

*Primary Examiner* — Akelaw Teshale
(74) *Attorney, Agent, or Firm* — Jackson Walker L.L.P.

(57) ABSTRACT

Methods and systems for thermal protection of a voice coil of a loudspeaker. The method involves driving the loudspeaker based on an input signal received at an input terminal and monitoring both a voltage applied to the voice coil and a current flowing through the voice coil. From the monitored voltage and current, an estimate of temperature of the voice coil and an estimate of power dissipation in the voice coil is determined. The method includes estimating the voice coil resistance based on the monitored voltage and current and at least the estimate of temperature is determined based the estimate of resistance. A gain control signal for modulating a gain applied to the input signal is generated as a function of both the estimate of temperature of the voice coil and the estimate of power dissipation in the voice coil. This means that high power dissipation, which would over long periods lead to overheating, can nevertheless be permitted when the voice coil temperature is low enough, while at high voice coil temperatures any gain modulation applied for thermal protection can be reduced if the power dissipation level drops.

33 Claims, 9 Drawing Sheets

(56) References Cited

U.S. PATENT DOCUMENTS

| | | | | |
|---|---|---|---|---|
| 2014/0086418 | A1* | 3/2014 | Lubberhuizen ........ | H04R 9/022<br>381/55 |
| 2014/0169571 | A1* | 6/2014 | Polleros ................ | H04R 3/007<br>381/55 |

* cited by examiner

LOUDSPEAKER PROTECTION SYSTEMS AND METHODS

BACKGROUND OF THE INVENTION

1. Field of the Invention

This invention relates to methods and apparatus for protecting loudspeakers, and especially to methods and apparatus for controlling the drive signal supplied to the loudspeaker so as to avoid over-temperature operation.

2. Description of the Related Art

A number of different products include audio circuitry, such as an audio amplifier, together with one or more loudspeakers and/or connections for driving one or more loudspeakers of a peripheral apparatus such as a headset. In some instances the loudspeaker(s) chosen will be robust enough and large enough to handle the maximum power level at which the amplifier could drive signals continuously into it, even under the worst case environmental conditions, for instance maximum supply voltage, maximum ambient temperature etc. However having robust enough loudspeakers is not always economical, and for portable devices in particular the desire is typically to make the speaker as small and light as possible. This can potentially lead to the audio drive circuitry overloading the loudspeaker. One particular problem is thermal overload of the loudspeaker.

A typical loudspeaker comprises a diaphragm which is driven by a voice coil supported relative to a magnet. In use, typically, an analog audio drive signal is applied to the voice coil to drive the loudspeaker. FIG. 1*a* illustrates an electrical model of a loudspeaker voice coil. When a voltage $V_{spka}$ is applied to the voice coil, a current $I_{spka}$ flows. The voice coil impedance observed as defined by $V_{spka}/I_{spka}$ comprises some inductance Lea, but at audio frequencies the ohmic resistance Rea of the coil winding dominates. It will be understood that power $P_d$ is dissipated in the loudspeaker, primarily as ohmic losses ($Pd=I_{spka}^2*Rea=V_{spka}^2/Rea$) in the voice coil which can cause heating of the voice coil. One particular problem to be avoided is overheating of the voice coil which could result in degradation in performance and/or damage to the loudspeaker. In some applications therefore there may be speaker protection circuitry for controlling the loudspeaker operation to avoid the voice coil temperature exceeding a specified limit.

FIG. 1*b* illustrates a thermal model of a loudspeaker. The thermal mass of the voice coil is modelled by thermal capacitance $C_{thvc}$ which is at temperature $T_{vc}$ above a reference temperature value $T_{ref}$, say 300K. As mentioned above ohmic power losses can result in heating of the voice coil and thus an increase in the voice coil temperature $T_{vc}$. Power (modelled as thermal current) flows through a thermal resistance $R_{thvcm}$ to the adjacent magnet with thermal inertia represented by thermal capacitance $C_{thm}$ and thence via further thermal resistance $R_{thma}$ to the outside world, assumed to be an independently defined ambient temperature $T_a$. It will be appreciated that this is a relatively simple model and more complex models could be developed if required, for instance including other components of the loudspeaker and/or temperature gradients within components such as the magnet.

The audio driving circuitry may therefore be limited in terms of the output power it can deliver to the loudspeaker so that the maximum power dissipated in the voice coil when flowing through the various thermal resistances to the ambient temperature does not cause the voice coil temperature to exceed some specified safe limit. This approach however requires assumptions about the thermal resistances of the voice coil and magnet and the worst case maximum ambient temperature. This will typically lead to conservative values being assumed which may lead to limiting of the output power to undesirably low levels.

Uncertainties in the relevant thermal resistances of the loudspeaker could in some instances be reduced by a measurement/calibration step for instance by extracting a thermal resistance from temperature versus power measurements. However due to the long thermal time constants involved such measurements typically take many seconds to be performed and thus are not typically suitable for self-calibration, e.g. on start-up or reset of a host device. Such a test could be performed as an initial factory calibration but even then would greatly extend production test time and thus increase cost and may not be suitable for a high-volume manufacturing process.

Even if the thermal resistances are well characterised there may be uncertainty about the ambient temperature. The ambient temperature could be measured in use but a single measurement of ambient temperature may be insufficient to take into account thermal gradients in the host device whereas using multiple sensors may add to the complexity and expense of the audio circuitry.

An alternative approach is therefore to measure the voice coil temperature itself with some sort of power limiting applied if a temperature threshold is crossed. This approach has the advantage of working from an actual indication of voice coil temperature but it has been appreciated the limiting applied may result in needless attenuation of some signals in some circumstances as discussed below.

SUMMARY OF THE INVENTION

Embodiments of the present invention provide methods and apparatus for speaker protection that at least mitigate at least some of the above mentioned disadvantages.

Thus according to the present invention there is provided a method of thermal protection of a voice coil of a loudspeaker comprising:

- driving said loudspeaker based on an input signal received at an input terminal monitoring both a voltage applied to said voice coil and a current flowing through said voice coil;
- determining both an estimate of temperature of said voice coil and an estimate of power dissipation in said voice coil based on said monitored voltage and current, wherein at least said estimate of temperature is determined based on an estimate of resistance of said voice coil and wherein said estimate of voice coil resistance is determined based on said monitored voltage and current; and
- generating a gain control signal for modulating a gain applied to said input signal within a signal path between said input terminal and said loudspeaker for thermal protection, wherein said gain control signal is generated as a function of both said estimate of temperature of said voice coil and said estimate of power dissipation in said voice coil.

The estimate of voice coil temperature may be based on: the difference between the value of said estimated voice coil resistance and a reference resistance value at a known temperature; and a temperature coefficient for the loudspeaker voice coil. At least one of the temperature coefficient and the reference resistance value may be determined in a calibration step.

In some embodiments the estimate of power dissipation is based on the estimated voice coil resistance and said monitored current. The estimate of power dissipation may be determined by multiplying the estimated voice coil resistance by the square of the value of said monitored current.

The method may comprise applying a first transfer function to the estimate of voice coil temperature to determine an allowed power limit, wherein the value of the gain control signal is a function of the allowed power limit. The first transfer function may provide a first constant value of the allowed power limit for any voice coil temperature below a first threshold. The first constant value of allowed power limit may be a maximum value of the allowed power limit and/or may be configurable in use. The first transfer function may be defined such that for any voice coil temperature below a first threshold no allowed power limit is applied and/or such that for any voice coil temperature above a second temperature threshold the allowed power limit is a second constant value. The second constant value of allowed power limit may be zero or may be a non-zero value that corresponds to a minimum value of allowed power.

For at least part of the expected range of voice coil temperature the first transfer function may be a linear interpolation from a first value to a second value. For at least part of the expected range of voice coil temperature the first transfer function may describe, in a plot of allowed power against voice coil temperature, a convex curve of from a first value to a second value.

In some embodiments generating the gain control signal comprises applying a second transfer function to the estimate of power dissipation to determine a gain control value, wherein the second transfer function is a function of the allowed power limit and wherein the gain control signal is based on the gain control value. The second transfer function may provide a first constant value for the gain control value for any power dissipation below a first threshold. The first constant value for the gain control value may correspond to a minimum gain modulation being applied to the input signal for thermal protection. The first constant value for the gain control value may be configurable in use.

The second transfer function may be defined such that for power dissipation below a first threshold gain modulation for thermal protection is applied and/or that for any power dissipation above the allowed power limit, the gain control value is a second constant value. The second constant value for the gain control value may be zero or a non-zero value that corresponds to a maximum gain modulation being applied for thermal protection.

For at least part of the expected range of power dissipation the second transfer function is a linear interpolation from a first value to a second value, wherein at least the second value depends on the allowed power limit. For at least part of the expected range of power dissipation the second transfer function describes, in a plot of gain control value against power dissipation, a convex curve of from a first value to a second value, wherein at least the second value depends on the allowed power limit.

In some embodiments generating the gain control signal comprises applying time domain processing to the gain control value. The time domain processing may comprise applying at least one of an attack time constant and a decay time constant to the gain control value to generate the gain control signal.

In some embodiments the gain control signal is generated so as to apply no gain modulation for thermal protection if the estimated voice coil temperature is below a gain modulation temperature threshold.

In some embodiments the gain control signal is generated so as to time the application of any gain changes to synchronise with zero crossings in the input signal. Additionally or alternatively the maximum frequency of gain changes applied may be maintained below a predetermined limit.

The gain control signal may control a gain element for applying a gain to the input signal. The gain control signal may be supplied to a gain controller which controls the gain of a gain element based on the gain control signal and at least one other gain setting. The at least one other gain setting may be one of: a user controlled volume setting; a gain control setting for excursion limiting.

Embodiments of the invention also relate to a thermal protection system for a loudspeaker. In another aspect of the invention therefore there is provided a thermal protection system for a loudspeaker comprising:

- at least one input for receiving a first signal indicative of voltage applied to the voice coil of the loudspeaker and a second signal indicative of current flowing in the voice coil;
- a temperature and power estimation module configured to determine an estimate of temperature of the voice coil and an estimate of power dissipation in the voice coil based on the first and second signals; wherein at least the estimate of temperature is based on an estimate of resistance of the voice coil which is determined based on the first and second signals; and
- a gain controller configured to generate a gain control signal for modulating the gain of a signal processing chain driving the loudspeaker, wherein the gain control signal is generated as a function of both the estimate of temperature of the voice coil and the estimate of power dissipation in the voice coil.

The system of this aspect of the invention may be arranged to perform any of the variants of the method described above.

The system may comprise a gain element for applying a gain to the input signal, the gain element being controlled by the gain controller. The gain controller may control the gain of the gain element based on the gain control signal and at least one other gain setting, such as a user controlled volume setting or a gain control setting for excursion limiting.

The system may also comprise a signal processing circuit for driving the loudspeaker. The system may comprise a loudspeaker. The system may be implemented in an electronic apparatus. Embodiments of the invention also relate to an electronic apparatus having such a protection system. The apparatus may be at least one of: a portable device; a battery power device; a computing device; a communications device; a gaming device; a mobile telephone; a personal media player; a laptop, tablet or notebook computing device.

The system may be implemented by a suitable processor. Thus aspects of the invention also relate to software code, for example stored on a non-transitory storage medium, which, when run on a suitable processor, performs the method described above and/or provides the protection system described above. The software code may be stored in memory of an electronic device.

Aspects of the invention also relate to an electronic device comprise memory containing software code and a suitable processor for performing the method described above.

In another aspect there is provide software code stored on a non-transitory storage medium, which when run on a suitable processor provides a gain control signal for controlling a gain applied upstream of a loudspeaker for thermal protection, the code comprise instructions to:

- accept signals representing a monitored voltage and a monitored current of a voice coil of a loudspeaker determine both an estimate of temperature of the voice coil and an estimate of power dissipation in the voice coil based on the monitored voltage and current, wherein at least the estimate of temperature is determined based on an estimate of resistance of the voice coil and wherein the estimate of voice coil resistance is determined based on the monitored voltage and current; and generate the gain control signal as a function of both the estimate of temperature of the voice coil and the estimate of power dissipation in the voice coil.

The software code may be stored in an electronic device that includes a suitable processor for running the code.

In a further aspect there is provided a module for thermal protection of a voice coil of a loudspeaker comprising: a gain controller configured to generate a gain control signal for modulating a gain of a signal processing chain driving the loudspeaker, wherein the gain control signal is based on both an estimate of temperature of the voice coil and an estimate of power dissipation in the voice coil.

The estimate of temperature of the voice coil may be based on an estimate of the present voice coil resistance. The estimate of the present voice coil resistance may be based upon both a voltage applied to the voice coil and a current flowing through the voice coil.

In a further aspect there is provided loudspeaker protection circuitry, for providing a gain control signal for controlling the gain applied to an input signal to provide a drive voltage into a loudspeaker voice coil, comprise a controller configured to:

receive signals indicative of the voice coil current and drive voltage;

calculate from the indicative signals, an estimate of the present voice coil temperature and an estimate of the power dissipation of the voice coil, wherein at least the estimate of voice coil temperature is based on an estimate of the present voice coil resistance which is determined from the indicative signals; and generate and output the gain control signal as a function of both the estimate of voice coil temperature and power dissipation.

BRIEF DESCRIPTION OF THE DRAWINGS

Embodiments of the invention will now be described, by way of example only, with reference to the accompanying drawings, of which.

DETAILED DESCRIPTION OF THE PREFERRED EMBODIMENTS

As mentioned above FIG. 1*b* illustrates a thermal model of a typical loudspeaker which explains how the output power from the audio driving circuitry can lead to an increase in the temperature of the voice coil. It will be understood that the various thermal time constants for the components of the model, i.e. the components of the loudspeaker may be quite different.

Audio signals are conventionally in the range of about 20 Hz-20 kHz with corresponding time constants of the order of 10 ms to 10 μs. The output audio power is usually determined over a plurality of cycles of the instantaneous audio signal but still within a period typically less than about 100 ms or so. It will be appreciated that for an audio track the amplitude of the input signal, i.e. the relative loudness of the intended sound signal, may vary throughout the track. For instance an audio track may have relatively louder and relatively quieter periods and may transition from quiet to loud, or vice versa, relatively quickly. In general then the amplitude of the audio drive signal (or the envelope of this signal) which is supplied to drive the loudspeaker may change relatively quickly and thus the power dissipated in the voice coil may also vary relatively quickly.

The thermal time constants of the speaker elements will however typically be much slower than the possible changes in the current and/or voltage, i.e. audio power, applied to the loudspeaker. The thermal time constant of the voice coil may generally be of the order of a few seconds or so, whereas the bulkier magnet may have a greater mass and thus a thermal time constant of more like tens of seconds. Clearly the exact thermal time constants and their relative values may vary depending on the actual loudspeaker construction or variations in manufacture of a particular loudspeaker.

Figure 1A:
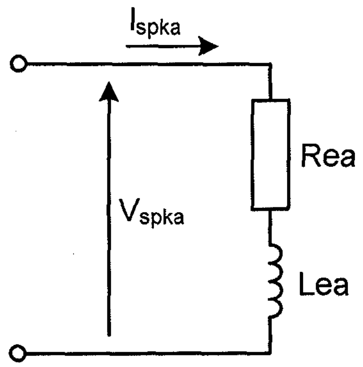
FIGS. 1*a* and 1*b* illustrate electrical and thermal models of a loudspeaker.
Figure 1B:
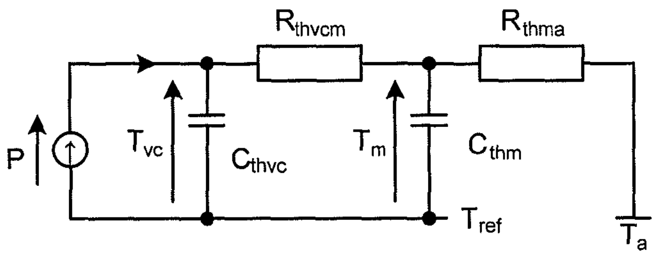
Figure 2:
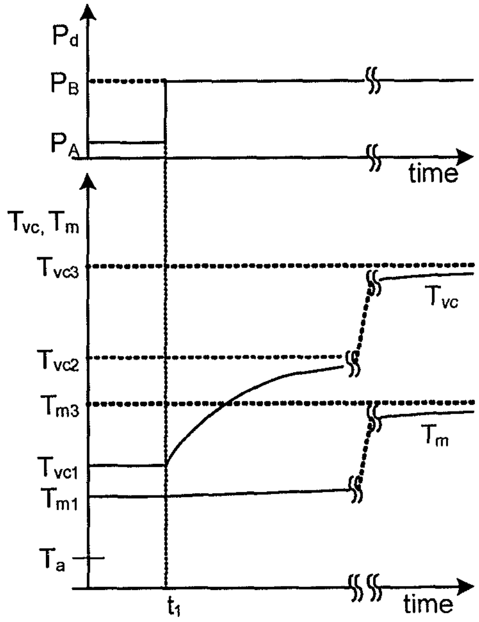
FIG. 2 illustrates the increase in temperature of the voice coil and magnet following an increase in output power for the model of FIG. 1.

FIG. 2 illustrates the response of the model of FIG. 1*b* to an increase in power, e.g. an increase in the drive signal amplitude, resulting in a change in power dissipated in the speaker from an initial low power $P_A$ to a fixed higher power $P_B$. FIG. 2 illustrates the power dissipated in the loudspeaker $P_d$ against time and also the temperature of various parts of the model against time.

It is assumed in FIG. 2 that the loudspeaker is initially in thermal steady-state. Initially therefore the voice coil and magnet are at steady-state temperatures $T_{VC1}$ and $T_{m1}$ defined by the thermal resistance to $T_a$ and by $P_A$ (i.e. $T_{VC1}=P_A\cdot(R_{thvcm}+R_{thma})$ and $T_{m1}=P_A\cdot R_{thma}$ respectively).

FIG. 2 illustrates that at time $t_1$, the power dissipated in the voice coil increases. On the timescales as shown in FIG. 2 this increase in power can be seen as sudden step change in power from $P_A$ to $P_B$. This consequently leads to increased heating of the voice coil. The temperature of the voice coil $T_{VC}$ thus starts to increase. Typically however the thermal mass of the magnet is much greater than that of the voice coil and thus the temperature of the magnet $T_{m1}$ initially stays relatively constant. The temperature of the voice coil $T_{vc}$ increases towards an asymptote of $T_{vc2}=P_B.R_{thvcm}+T_{m1}$ with a thermal time constant $T_{vc}=R_{thvcm}.C_{thvc}$.

Eventually the thermal capacitance $C_{thvc}$ of the voice coil is almost charged up to $T_{vc2}$ and most of the dissipated power (thermal current) then flows into the larger magnet thermal capacitance. At this point the temperature of the magnet will start to increase towards an asymptote $T_{m3}=P_B.R_{thma}$. This increase in temperature will have a longer time constant and thus FIG. 2 shows only the temperature nearing the asymptote for clarity. As the temperature of the magnet increases the rate of change of voice coil temperature will decrease and the temperature difference of the voice coil over the magnet will approach $P_B.R_{thvcm}$, thus the voice coil temperature will approach an asymptotic temperature $T_{vc3}=P_B.(R_{thvcm}+R_{thma})$ where the thermal capacitances are charged up to their steady-state temperatures and all the thermal current flows through the thermal resistances.

It will be appreciated that if the ambient temperature $T_a$ were to be higher (e.g. by $\Delta T_a$) then the whole family of curves would rise by an amount $\Delta T_a$, giving a larger temperature and hence reaching any fixed temperature threshold more quickly. It will be appreciated the ambient temperature experienced by the magnet may be determined by several independent paths into the case or chassis of the host device and, for example factors such as whether it is hand-held, or in a docking station, lying in particular orientation, exposed to direct sunlight etc.

Given the relatively long thermal time constants of the loudspeaker components, and the fact that the audio power dissipated may be reduced much more quickly, it is possible to allow the audio drive circuitry to generate short term output signals of a magnitude that is significantly larger than would be advisable in continuous operation but without exceeding a voice coil temperature limit.

For example consider that the voice coil temperature should not exceed a first temperature limit $T_{max}$ and that the value of the asymptote temperature $T_{vc1}$ is greater than this first temperature limit $T_{max}$, i.e. in other words for a given ambient temperature $T_a$ long term operation with an audio power level $P_B$ would lead to the voice coil temperature exceeding $T_{max}$. It has been appreciated that it would be possible to operate at audio output power level $P_B$ for at least a certain period of time without the voice coil exceeding $T_{max}$, provided that the output power is then reduced to a lower level.

As mentioned above it is possible to determine the temperature of the voice coil of the loudspeaker and apply limiting to the drive signal, for example applying a gain modulation to attenuate the drive signal, if the voice coil temperature approaches the first limit $T_{max}$, for example if some temperature threshold $T_{th}$ somewhat lower than the $T_{max}$ is crossed. In some instances the gain modulation applied may be a function of the determined voice coil temperature so that the higher the voice coil temperature the greater the gain reduction applied. In this way the drive signal may be modulated to ensure that the power dissipated in the voice coil is reduced as the voice coil temperature increases.

It has been appreciated that this may lead to unnecessary limiting in some instances. For instance if the temperature of the voice coil is above a threshold this approach leads to a gain reduction being applied until the temperature reduces. If however the input audio signal drops to a signal level that would, in the absence of the gain reduction only lead to a power dissipation of $P_A$ that is low enough not to cause the temperature limit $T_{max}$ to be exceeded even if it were applied permanently, it may no longer be necessary to apply any gain modulation. However until the voice coil temperature has reduced below the threshold the signal would still in fact suffer a reduction in gain, unnecessarily.

Embodiments of the present invention therefore determine an estimate, i.e. an indication, of both the power dissipation of the voice coil, i.e. load, and the temperature of the voice coil, in order to determine the level of any gain modulation that is to be applied to an input signal for the purposes of thermal protection of the voice coil and hence the loudspeaker. Determining an estimate of both the voice coil power dissipation and voice coil temperature, i.e. deriving or calculating indicative values of the power dissipation and temperature, allows appropriate gain modulation to be applied to the audio drive signal. From these estimates a gain control signal is generated as a function of both the estimated power dissipation and the estimated temperature. The gain control signal controls modulation of a gain applied to the input signal which is used to drive the loudspeaker, the gain being applied in the signal path between an input terminal or node for receiving the input signal and the loudspeaker.

To estimate the voice coil power dissipation and voice coil temperature, the drive voltage applied to the loudspeaker and the current flowing in the voice coil are monitored. Thus estimating the voice coil power dissipation and voice coil temperature comprises deriving or calculating indicative values of the power dissipation and temperature from the monitored voltage and current values. The voice coil temperature is estimated by estimating the voice coil resistance based on the monitored values of current and voltage.

Figure 3A:
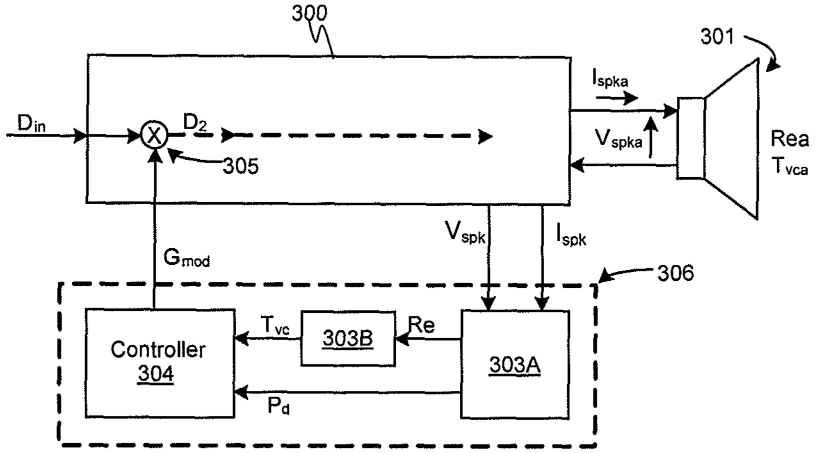
FIGS. 3*a* and 3*b* illustrate an embodiment of speaker protection circuitry according to the present invention.

FIG. 3*a* illustrates an embodiment of the invention. Signal processing chain 300 receives a digital input audio signal $D_{in}$ at an input terminal and processes it, eventually providing a signal to drive a loudspeaker 301. The input terminal may be a circuit contact such as bond pad or the like for connecting to another circuit or could simply be a node of a signal path which represents the input to the signal processing chain. For the avoidance of doubt the phrase "input terminal" as used herein includes an input node and no particular physical characteristics are implied by the word "terminal". The signal processing chain comprises a multiplier or digital gain stage 305 in the signal path and may also comprise elements such as digital filtering or other digital signal processing, digital-to-analog convertors, and/or at least one Class D, Class AB or Class G or Class H power amplifier stage and associated modulation circuitry. The signal processing chain will have an overall gain from the input signal $D_{in}$ to the voltage signal $V_{spka}$ driven into the loudspeaker.

It should be noted that the digital processing circuitry may comprise at least some custom-designed logic circuitry and/or may comprise a general purpose processor running appropriate code. The loudspeaker may be grounded externally and driven from a single output terminal, or both loudspeaker terminals may be connected to the signal processing chain for example where both terminals are driven in from a full-bridge output stage or where the ground return current is passed through the driver circuitry as illustrated.

The signal processing chain 300 also comprises circuitry for sensing the current $I_{spka}$ actually flowing through the voice coil of the loudspeaker. This current $I_{spka}$ may, for example, be sensed in a power supply or ground return lead, monitored in series with the load, or monitored by sensing current through or voltage across amplifier output elements.

In this embodiment circuitry in the signal processing chain provides signals $V_{spk}$ and $I_{spk}$ indicative of the voice coil drive voltage $V_{spka}$ and voice coil current $I_{spka}$ respectively to loudspeaker protection control module 306. The loudspeaker protection control module 306 receives these indicative signals $V_{spk}$ and $I_{spk}$ and derives an appropriate gain control signal $G_{mod}$ to control the digital gain stage 305 in order to modulate, i.e. reduce or increase, the gain of the signal processing chain so as to modulate the signal applied to the loudspeaker to a safe level. When the indicative voltage and current signals $V_{spka}$ and $I_{spk}$ suggest that there is danger of thermal overload of the loudspeaker the gain applied to the input signal $D_{in}$ is modulated such that it reduces the signal applied to the loudspeaker.

The loudspeaker protection control module 306 comprises power and resistance estimation module 303A, which is arranged to determine, e.g. calculate, an estimate Re of the voice coil resistance of the loudspeaker from the indicative voltage and current signals $V_{spk}$ and $I_{spk}$. The power and resistance estimation module also determines an estimate $P_d$ of the present power dissipation based on the monitored voltage and current signals $V_{spk}$ and $I_{spk}$, either directly from the monitored signals or using the estimated value of resistance Re. The loudspeaker protection control module 306 also comprises temperature estimation module 303B, which calculates, i.e. derives, an estimate $T_{vc}$ of the voice coil temperature from the estimated voice coil resistance Re.

The loudspeaker protection control module 306 further comprises controller 304 which generates the gain control signal $G_{mod}$, based on, i.e. as a function of, both the voice coil power dissipation estimate $P_d$ and the voice coil temperature estimate $T_{vc}$ In general terms, the controller 304 receives information related to both the power dissipation in the voice coil and the temperature of the voice coil and can, from this information, thus ensure that the correct gain modulation is applied. For speaker thermal protection the gain modulation applied will reduce the magnitude of the driving signal so as to reduce power dissipation. Typically therefore the gain modulation may be a modulation to reduce the overall gain. Thus if the power dissipation is relatively high and the voice coil temperature is also relatively high a gain modulation may be applied to reduce the gain applied to the input signal so as to reduce the level of power dissipation. If the envelope level of the input signal then decreases the power dissipation will also consequently reduce further. At this point the controller 304 may partly or fully remove the gain reduction previously applied, thus avoiding needless reduction of the output audio signal.

In other words for at least some values of temperature and power dissipation an increase in temperature of the voice coil can result in a gain modulation being applied to reduce the magnitude of the drive signal and a decrease in temperature of the voice coil can result in gain modulation being applied to increase the magnitude of the drive signal. In addition an increase in power dissipation of the voice coil can result in a gain modulation being applied to reduce the magnitude of the drive signal and a decrease in power dissipation can result in gain modulation being applied to increase the magnitude of the drive signal.

Figure 3B:
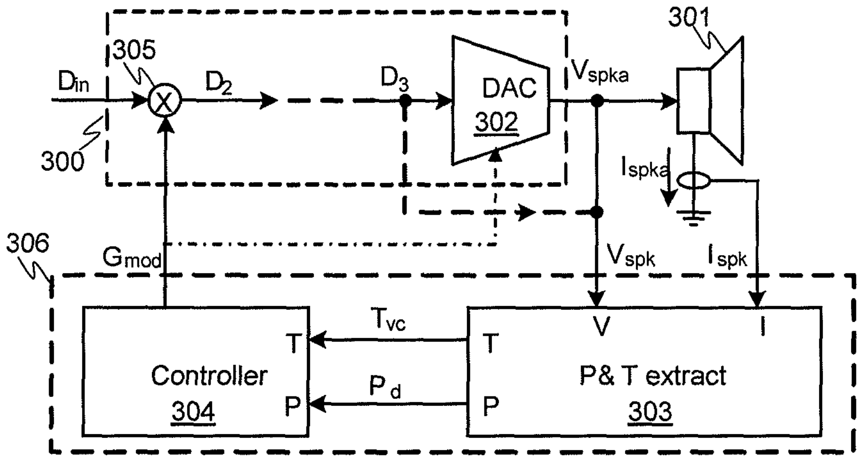

FIG. 3*b* illustrates in more detail an embodiment of the invention. The loudspeaker 301 is driven by an audio output stage 302 of the signal processing chain 300. In this example the output stage 302 is a digital-to-analog converter (DAC) that receives a digital signal $D_3$ (which may be the same as the input signal $D_{in}$ scaled by a gain element 305 to provide a signal $D_2$ or a further processed version thereof) and generates an analog driving signal $V_{spk}$ which is supplied to the voice coil of the loudspeaker 301. It will of course be appreciated that in other embodiments an analog amplifier could be used to generate the speaker driving signal, possibly downstream from a DAC or which receives an analog input audio signal. It will also be appreciated that an audio signal processing chain 300 may comprise additional circuit components such as additional gain stages or signal processing stages, e.g. noise shaping stages, which have been omitted from FIG. 3 for clarity. The chain may comprise various classes of power amplifiers including Class AB, Class G or Class D. The loudspeaker may be connected between an amplifier output terminal and a ground return terminal as shown, or both terminals of the speaker may be driven in a full-bridge mode.

As mentioned above the current through the voice coil of the loudspeaker is monitored and may be sensed in a power supply or ground return lead, monitored in series with the load, or monitored by sensing current through or voltage across amplifier output elements. In the embodiment illustrated in FIG. 3*b* an estimation module, i.e. power and temperature extraction block 303, is arranged to determine an indication or estimate of the voice coil temperature and also an indication or estimate of the present power dissipation of the loudspeaker. In the embodiment illustrated in FIG. 3*b* both the voice coil temperature and the power dissipation are estimated from the electrical parameters of the audio circuitry, in particular the voice coil current and the applied voice coil voltage signal.

The estimation module is therefore configured to receive an indication $I_{spk}$ of voice coil current of the loudspeaker and also an indication $V_{spk}$ of the drive signal voltage applied to the loudspeaker, i.e. the drive voltage applied to the loudspeaker voice coil and the current flowing through the voice coil are monitored.

The determined values of voice coil power dissipation $P_d$ and voice coil temperature $T_{vc}$ are provided to controller 304 which can determine whether any gain modulation is required. The controller 304 may generate a gain control signal $G_{mod}$ to control modulation of a gain applied to the input signal $D_{in}$, for example as applied by a gain element 305 and/or any gain applied by the audio output stage 302. The controller 304 can thus ensure that any reduction in gain applied for speaker thermal protection reasons is only applied when required. Thus if the power dissipation is relatively high and the voice coil temperature is also relatively high a gain modulation may be applied to reduce the gain applied to the input signal so as to reduce the level of power dissipation. If the temperature of the voice coil continues to rise, or the power dissipation increases, the gain may be reduced further. If however the envelope level of the input signal then decreases the power dissipation will also consequently reduce further. At this point the controller 304 may adjust the level of gain modulation so as to increase the gain applied, i.e. to partly or fully remove the gain reduction previously applied. Note as used herein the term reduce the gain shall be taken to mean modulating the processing applied to vary the resultant signal level so as to reduce the magnitude of the output signal compared to the magnitude of the input signal. Reducing the gain may include reducing the level of any amplification applied (which normally enlarges signal magnitude) and/or increasing the amount of attenuation applied (which normally diminishes signal amplitude). Increasing the gain shall mean the opposite. For the avoidance of doubt the term amplify shall be taken to generally refer to controlling the amplitude level of a signal and thus can include attenuating a signal.

The controller 304 may therefore be configured to determine an allowed power limit based on the indication of voice coil temperature and determine the value of the gain control signal, for modulating the gain applied to the drive signal voltage as a function of the indication of power dissipation in the loudspeaker and the allowed power limit. Thus a greater gain modulation may be applied the closer the estimated value of power dissipation is to the allowed power limit. Together the estimation module 303 and controller 304 comprise loudspeaker protection control module 306.

Figure 4:
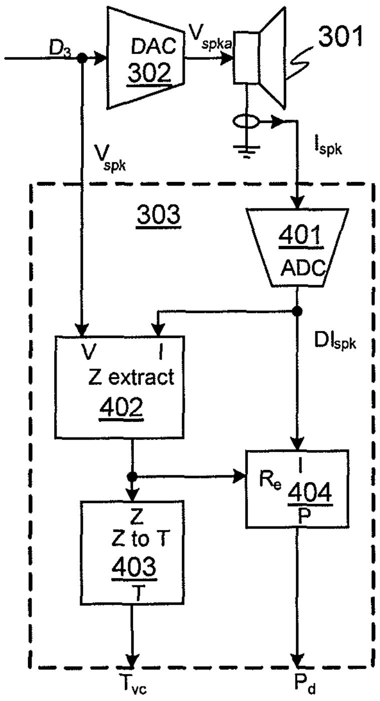
FIG. 4 illustrates one example of suitable temperature and power extraction circuitry.

FIG. 4 illustrates one embodiment of a suitable estimation module, i.e. power and temperature extraction block 303. The voice coil current $I_{spk}$ is monitored by a suitable current sensor as is well known in the art. This current value $I_{spk}$ may be converted to a digital current signal $DI_{spk}$ (i.e. a digital signal indicative of current $I_{spk}$) by an ADC 401 possibly after some pre-processing e.g. analog filtering, amplification etc. The digital current signal $DI_{spk}$ is provided to an impedance extraction block 402. The impedance extraction block also receives an indication of the applied voltage, i.e. the drive voltage is monitored. In this embodiment the digital signal $D_3$ input to the DAC 302 may be provided as an indication of the voltage of the drive signal $V_{spk}$. In other words monitoring the drive voltage may comprise monitoring the digital signal used to generate the drive signal. However as illustrated in FIG. 3 it would alternatively be possible to monitor the drive signal $V_{spk}$ directly. It would also be possible to use the input signal $D_{in}$ itself together with an indication of the value of the gain control signal and allowing for this and any other gain applied in the signal path.

The impedance extraction block 402 determines an estimate of the present resistance Re of the voice coil, for example based on the relationship $Re=V_{spk}/I_{spk}$, although more sophisticated known techniques such as those involving adapting coefficients of an adaptive filter may be used if desired.

The estimated value of resistance may be used to determine the temperature $T_{vc}$ of the voice coil by temperature estimation block 403. The resistance of the voice coil will have a temperature coefficient that may be known from an initial calibration step or estimated based on the type of loudspeaker used. The temperature coefficient may typically be of the order of about 4000 ppm/K. The variation of the estimated resistance with respect to some reference value, which may for instance be a stored nominal or test calibration value or which may be acquired in a self calibration routine, for instance on start up, can be used to determine an estimated temperature of the voice coil. Note such a calibration would be purely an electrical measurement, at a single nominal temperature, so would not require the long measurement times of the order of the thermal time constants required for thermal impedance measurements. If the calibration value is obtained in production test, e.g. of the complete host device or of just a flex circuit comprising the loudspeaker and associated circuitry) the ambient temperature may be well controlled and known. If the calibration is performed every time a user starts up a device or a loudspeaker application, the ambient temperature may be unpredictable, in which case the host device may comprise an independent temperature sensor to provide information on the actual ambient temperature and by implication the present temperature of the voice coil.

The estimate of voice coil resistance is passed to power calculation block 404 which derives an estimate $P_d$ of the power dissipation of the voice coil. The power calculation block, in this embodiment, determines the power dissipated using the digital representation $DI_{spk}$ of the speaker current Ispk and the determined resistance based on the relationship $P_d=I_{spk}^2.Re$. It will be noted that it would alternatively be possible to estimate the power dissipated using the determined resistance and a measured coil voltage based on the relationship $V_{spk}^2/Re$ ($V_{spk}$ may be available with greater accuracy than $I_{spk}$ but there is a computational advantage in the former approach which avoids phase lag issues due to coil inductance in sensing the coil voltage) and or directly from the monitored current and voltage values. The power calculation block may calculate the power over a plurality of audio cycles, say over a few tens to hundreds of milliseconds.

Figure 5:
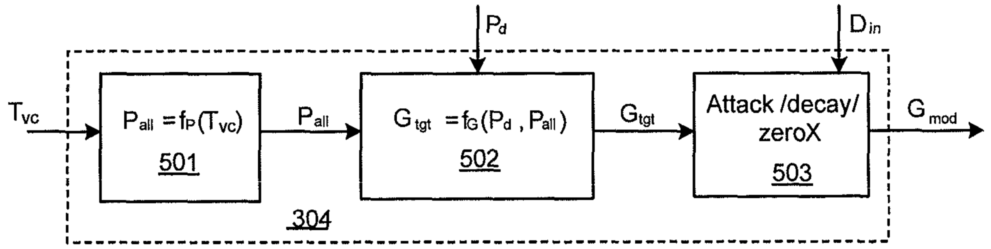
FIG. 5 illustrates one example of suitable control circuitry.

The estimated values of temperature and power dissipation are then passed to the controller 304. FIG. 5 illustrates one example of a suitable controller. The estimated voice coil temperature value $T_{vc}$ is received by a power limit block 501 which, based on the present voice coil temperature determines the maximum short term or instantaneous power dissipation level that is permitted. This maximum allowed power value $P_{all}$ will be determined by a desired first transfer function $f_p(T_{vc})$, the form of which may vary depending on the particular implementation but which will generally decrease with increasing temperature, reducing to a level at or near zero at a certain temperature limit $T_{max}$.

A gain calculation block 502 receives the indication of the allowed short-term power level $P_{all}$ and also the estimate of the present level of power dissipation $P_d$. The gain calculation block determines a gain control value, e.g. a target gain $G_{tgt}$, to be applied to the input signal, depending on the estimated present power dissipation, with the aim of keeping the instantaneous power dissipated less than $P_{all}$.

In some embodiments the target gain signal $G_{tgt}$ may be used directly as a gain control signal. In some embodiments however a gain control block 503 may apply some time-domain processing on the target gain signal, for instance to reduce any audio artefacts caused by gain changes. For instance gain changes may only be applied when the input signal crosses zero to avoid steps introduced by gain changes applied to a non-zero part of the signal. The gain control block 503 may therefore also receive the input signal $D_{in}$ and synchronise the gain changes with respect to zero crossings to produce the gain control signal $G_{mod}$.

As mentioned above in general the allowed power dissipation limit, $P_{all}$, will reduce towards zero as the voice coil temperature $T_{VC}$ reaches a specified maximum voice coil temperature $T_{max}$ for the relevant loudspeaker, which may for instance be based on a recommendation from the loudspeaker manufacturer. This aims to ensure that $T_{vc}$ will never exceed $T_{max}$. However rather than reduce the gain to zero suddenly when $T_{max}$ is reached, for instance by disabling the audio output stage, the gain is preferably gradually wound down (as the magnet slowly heats up) allowing a graceful and less noticeable reduction in signal, but still fast enough relative to the thermal time constants of the speaker to avoid exceeding $T_{max}$. For instance the gain may decrease monotonically with temperature, at least over a range between a defined threshold temperature $T_{th}$ and $T_{max}$.

Figure 6:
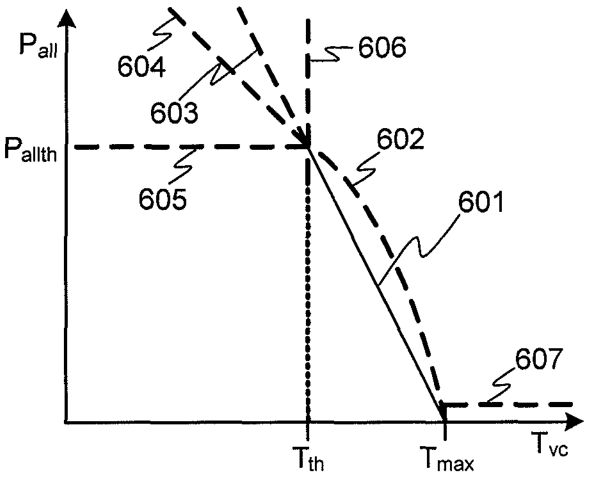
FIG. 6 illustrates various forms of possible transfer functions between estimated voice coil temperature and maximum allowed power.

FIG. 6 illustrates various forms of the first transfer function, $f_p(T_{vc})$ for determining the maximum allowed power dissipation $P_{all}$ in power limit block 501. One possible form of $f_p$ is a linear interpolation between a threshold value $P_{allth}$ at $T_{vc}=T_{th}$ to zero at $T_{max}$ as illustrated by solid line 601.

Alternatively a more aggressive design might use a function with some convex curvature between these values such as illustrated by curve 602.

Below the threshold temperature $T_{th}$, the line or curve may just be continued continuously, e.g. according to line 603. In such an embodiment it will be appreciated that there is no threshold temperature as such, just a function defined over a complete anticipated range of temperature. This may lead to very high power levels being permitted by this block, but in practice this may be limited elsewhere in the system, e.g. by the finite input signal range, or the output stage's supply voltage, or some maximum current limit imposed by a speaker driver amplifier. In a different approach limiting may be applied across the whole temperature range but the local transfer function may vary above and below the temperature threshold, e.g. the gradient may change as indicated by line 604.

Alternatively, the power limit may be set to a first constant value $P_{allth}$ below the temperature threshold $T_{th}$, as illustrated by line 605, especially if the threshold temperature $T_{th}$ is a relatively low temperature compared to $T_{max}$ such that $P_{allth}$ so is high a power that it is rarely reached, or if the maximum power is desired to be limited for some non-thermal reason, for instance to avoid damage to the user's ears.

As a further alternative the maximum allowed power may not be limited at all below the threshold temperature $T_{th}$, as illustrated by line 606.

In some embodiments, rather than reduce the maximum allowed power to zero at $T_{max}$, $P_{all}$ may be set to a small second constant value, less than and possibly significantly less than that which is expected to cause any thermal problems, as indicated by line 607. This will allow the gain subsequently derived to be non-zero avoiding any complete suppression of signal. In some embodiments this may be desirable to ensure some minimum output speaker signal to allow ongoing coil resistance (i.e. temperature) monitoring. This minimum gain may also prevent noise etc. in the temperature measurement from consequently modulating the gain over a range which may be small on a linear scale but noticeable on a log scale and hence give rise to audible artefacts, although it will be appreciated that this could also be handled in the time-domain function, e.g. using some fixed time-out or similar. Maintaining a small but non-zero drive signal $D_2$ may also be useful to avoid unwanted operation of some downstream auto-mute function in the signal processing chain.

One or more of the parameters such as $P_{allth}$, $T_{th}$, and $T_{max}$ may be fixed in hardware or stored in a suitable non-volatile memory. Suitable values may be set in chip manufacture or in subsequent end-user device manufacturing. In some instances the control circuitry may be associated with the audio drive circuitry but may read one or more parameter values from a memory associated with the loudspeaker. In some embodiments at least some of these parameters may be configurable and may vary during use, for example controlled by a control input (not shown). For example if a temperature-independent value of $P_{allth}$ is used below the threshold temperature $T_{th}$ and this value is set at least partly for user ear protection, it may be set to decrease over time as the monitored period of exposure increases.

Figure 7A:
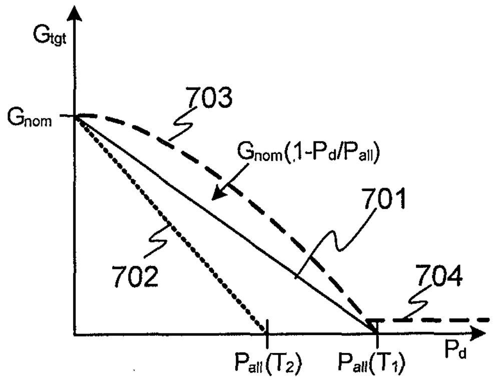
FIGS. 7*a* and 7*b* illustrate various forms of possible transfer functions between gain modulation and estimated power dissipation based on the determined maximum allowed power.
Figure 7B:
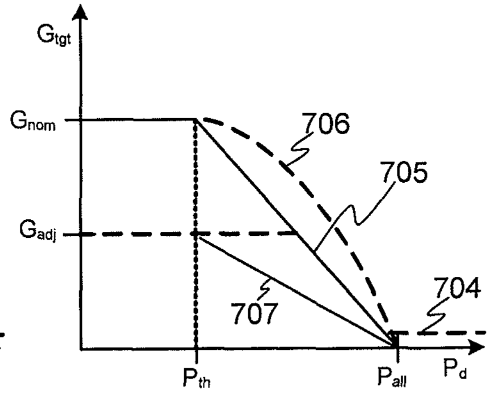

As mentioned the gain calculation block 502 receives the determined maximum allowed power level and determines the target gain based on the current power dissipation. A second transfer function $f_G(P_d, P_{all})$ for determining the target gain may take various forms as illustrated in FIGS. 7*a* and 7*b*. FIGS. 7*a* and 7*b* illustrate how the target gain value may be adjusted in accordance with the estimated power dissipation $P_d$ for different values of the maximum allowed power $P_{all}$.

FIGS. 7*a* and 7*b* illustrate that $G_{tgt}$ may be set to reduce from some nominal value $G_{nom}$ with increasing values of $P_d$. The nominal gain value may be defined consistently with the gain of other elements of the system to provide the required gain between output power of the drive signal and the input audio signal, e.g. the digital input signal $D_{in}$. The nominal gain value can be regarded as unity if other gains in the signal processing chain are defined appropriately.

FIG. 7*a* illustrates that the target gain $G_{tgt}$ may be defined as a linear interpolation from $G_{nom}$ at zero power to zero at $P_{all}$, i.e. $G_{tgt}=G_{nom}.(1-P_d/P_{all})$. Line 701 illustrates this interpolation for a first value of $P_{all}$, i.e. at a first voice coil temperature $T_1$. If the temperature of the voice coil increases over time, to say $T_2$ then $P_{all}$ will decrease to $P_{all}(T_2)$. This will lead to a steeper gradient in the decrease from $G_{nom}$ to zero as illustrated by curve 702.

It will again be appreciated that changes in the power dissipated can occur over relatively quick timescales and can occur faster than the time constant of temperature change of the voice coil or magnet. Thus for rapid changes of the dissipated power the value of $P_{all}$ may be substantially unchanging and thus the particular target gain vs. dissipated power function will be substantially fixed. Over a longer timescale however the voice coil temperature may change and thus the particular gain vs. power profile may also vary. This could lead to a change in gain being applied some time after the input signal level has stabilised.

It will be appreciated that the discussion with reference to FIGS. 7*a* and 7*b* has focussed on generating a gain control value which is a target gain setting for thermal protection, i.e. a value corresponding to the gain to be applied. Thus the target gain drops with increasing values of power dissipation $P_d$. Equivalently however the gain control value could be a gain modulation value, indicating the magnitude of the modulation to the nominal gain setting, which would increase with power dissipation.

It can therefore be seen that in general the speaker protection module of embodiments of the present invention generates a control signal for modulating the gain applied to an input audio signal used to drive a loudspeaker based on a measure of the present voice coil temperature of the loudspeaker and an indication of the power dissipation in the loudspeaker. The gain applied may vary in accordance with changes in the power dissipated in the loudspeaker (at least with a range of expected operating temperature) and the amount of change of gain resulting from a given change in power dissipation depends on the voice coil temperature (via the $P_{all}$ dependence).

It will be noted that as the temperature of the voice coil $T_{vc}$ approaches the maximum allowed temperature $T_{max}$, and thus $P_{all}$ approaches zero, the slope of the gain curve thus increases, in theory to infinity if $T_{vc}$ actually reaches $T_{max}$ and $P_{all}$ were reduced to zero. A very steep gradient for the gain curve may give audible artefacts as the input signal power varies. To reduce the maximum gain slope on a dB scale for low gains the minimum value of $P_{all}$ may be limited to a non-zero value as described above.

If the value of $P_{all}$ is at a maximum value, for instance $P_{allth}$, the gain adjustment may just be disabled, i.e. set to the nominal value $G_{nom}$. In effect this means that the target gain is set to its nominal or maximum value, for voice coil temperatures which are less than the threshold temperature, i.e. when $T_{vc}<T_{th}$.

Instead of a linear interpolation between $G_{nom}$ and zero (for a given value of $P_{all}$) a more aggressive curve with convex curvature may be employed to allow more power at intermediate temperatures, as illustrated by curve 703. For example a transfer function of the form $G=G_{nom}\cdot\text{sqrt}(1-P_d/P_{all})$ could be used to give a linear interpolation of power gain rather than voltage gain.

Rather than setting the target gain to zero when $P_d$ is equal to (or greater than) $P_{all}$, the target gain $G_{tgt}$ may be set to a small value, less or much less than that which is expected to cause any significant temperature overshoot, as illustrated by line 704. This may be preferred to complete attenuation of the drive signal for the same reasons as described above (with respect to setting $P_{all}$ to be a small non-zero value rather than zero).

To avoid any gain modulation while only small signals are applied to a voice coil, the target gain $G_{tgt}$ may be defined to be constant, e.g. equal to the nominal gain value $G_{nom}$, up to some threshold output power $P_{th}$ as illustrated in FIG. 7*b*. When the power dissipation threshold is reached it may then be subject to some linear interpolation 705 or non-linear interpolation 706 with a gradient based on the value of $P_{all}$, similar to that described with respect to FIG. 7*a*. For example when $P_d$ is greater than $P_{th}$ the target gain may be equal to $(1-(P_d-P_{th})/(P_{all}-P_{th}))$, possibly again being reduced to zero or some small level 704.

It should be noted that gain factors described above are defined as voltage gain factors, suitable for applying to the signal as a simple multiplication, rather than power gain (i.e. the square of a voltage or digital signal gain) even though defined with respect to a power variable. In some embodiments the gain control signal may be generated as a non-linear gain value, for example representing the required gain in decibels or such like coupled to a gain control stage 305 configured suitably.

In some embodiments the gain control for thermal protection may be combined with a gain control applied for user volume control. Thus gain element 305, e.g. a digital multiplier, may be arranged to apply a gain modulation to the input signal that applies any user volume controller gain along with any gain modulation for thermal protection (and/or any other required gain modulation such as for excursion limiting or ear protection). The gain controller 304 may therefore also receive an additional gain control signal, such as a user volume control signal. In some embodiments the nominal gain value $G_{nom}$ may be modulated by such a user volume control signal to become a new value $G_{adj}$. This may scale the whole characteristic vertically such that the gain is maintained at $G_{adj}$ until the threshold $P_{th}$ is reached and then reduced down to zero (or to the defined small non-zero level) at some threshold value $P_{allth}$, as illustrated by segment 707. Preferably however the gain may be maintained equal to $G_{adj}$ until it intercepts the previous nominal interpolation function, e.g. 705, thus avoiding the need for any signal attenuation until higher power levels.

As mentioned above a gain control block 503 may apply some time-domain processing on the target gain signal to improve the implementation of the required gain change. It will be appreciated that a change in gain could in some instance lead to an audible artefact in the audio and the time-domain processing may aim to reduce or eliminate such artefacts.

Such time domain processing may include zero-crossing detection of the input signal $D_{in}$. For instance gain changes may only be applied when the input signal crosses zero to avoid steps introduced by gain changes applied to a non-zero part of the signal.

The time domain processing may additionally or alternatively comprise applying decay time constants to limit the rate of change of any gain reductions applied to the signal so as to reduce any audible artefacts. Such decay time constants may be longer than audio signal time constants but shorter than any thermal time constants.

The time domain processing may additionally or alternatively comprise applying attack time constants to limit the rate of change of any gain increases applied to the signal, e.g. as the voice coil cools down following a reduction in the amplitude of the drive signal (possibly due to a reduced input signal and/or a reduction in gain being applied). Such attack time constants may be longer than audio signal time constants. They may be longer than at least one of the thermal time constants. This may reduce possible thermal oscillations and consequent unnecessary or avoidable gain modulations.

Additionally or alternatively the gain control 503 may be arranged to apply time-outs or minimum intervals between gain updates, to limit the maximum frequency of gain changes and hence any audio artefacts.

As mentioned above if there is no or little output power it may be difficult to obtain an accurate estimate of coil temperature, in which case a time-out may be imposed before the gain is recovered enough to obtain a revised temperature estimate.

As mentioned above, the various parameters of the power limit block 501 may be fixed in hardware or stored in memory and/or may be configurable in use. Likewise the parameters of the gain calculation block and gain control block may similarly be fixed in hardware or non-volatile memory and may be set in chip or end-user device manufacturing. One or more parameters may vary during use, e.g. controlled by a further control input. The calculation of functions $f_p$, $f_G$ may be implemented via look-up tables or by customised or programmable processing hardware implementing the desired algebraic formulae.

It will be appreciated by one skilled in the art that the loudspeaker protection control module 306 may be implemented by dedicated electronic circuit components and/or by various processing elements such as a general purpose programmable digital processor or FPGA array or the like suitably programmed. For example the power and temperature extraction block 303 and/or the controller 304 may be implemented, at least partly, as software modules running on a suitable processor. The term modules and block should therefore be read as covering both software modules or hardware modules or a mixture of both software and hardware. Any references to circuitry for these components could also mean suitable general processing circuitry.

The response over time of an embodiment of the present invention, e.g. an embodiment such as described with reference to FIG. 3, to a step increase in input signal level which large enough to cause an over-temperature if applied with nominal gain indefinitely will now be described with reference to FIGS. 8*a-d*.

Figure 8A:
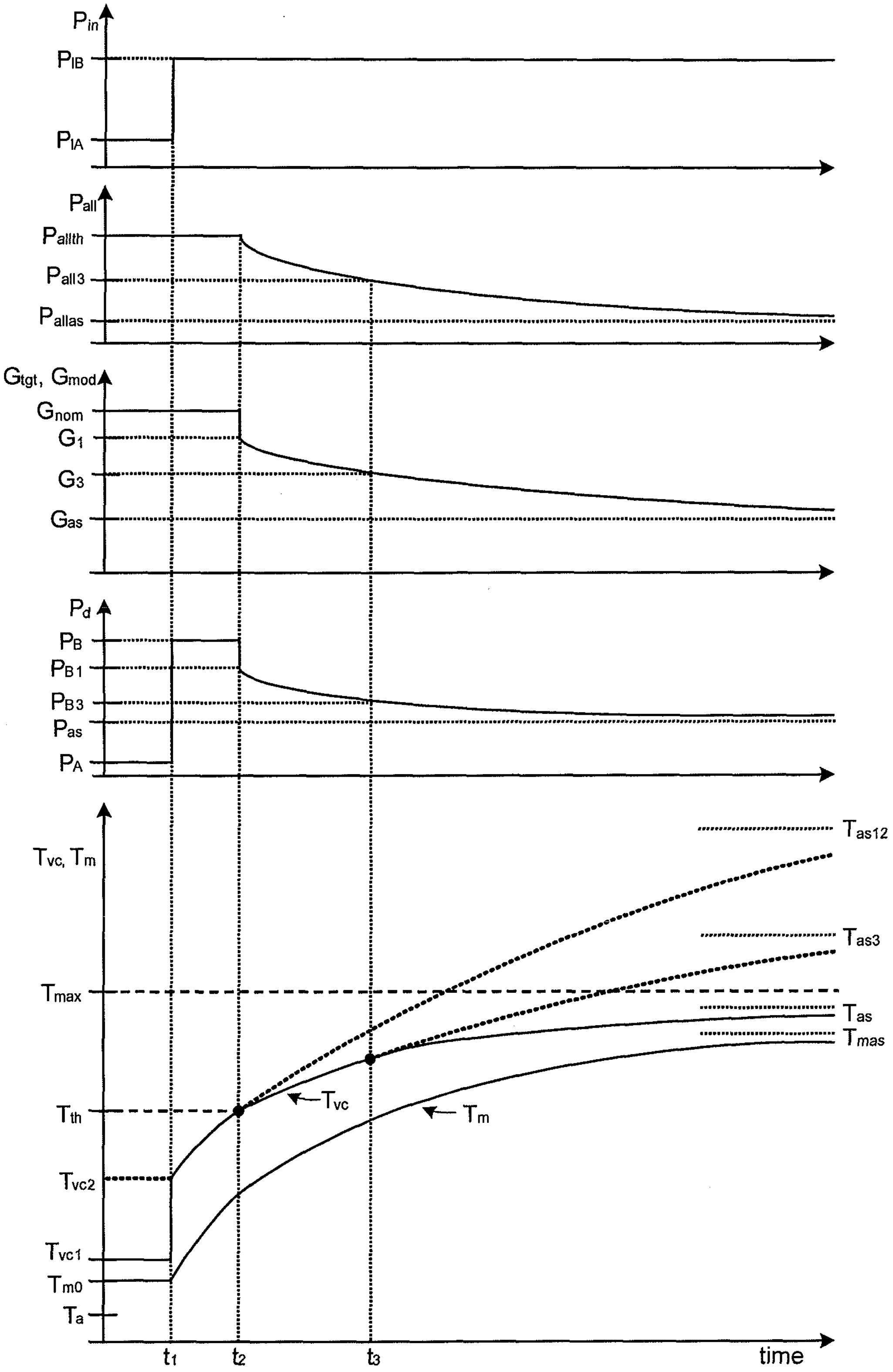
FIGS. 8*a* to 8*d* illustrate the response of an embodiment of the invention to an increase in input power level and illustrate how the allowed power and target gain settings may vary.
Figure 8B:
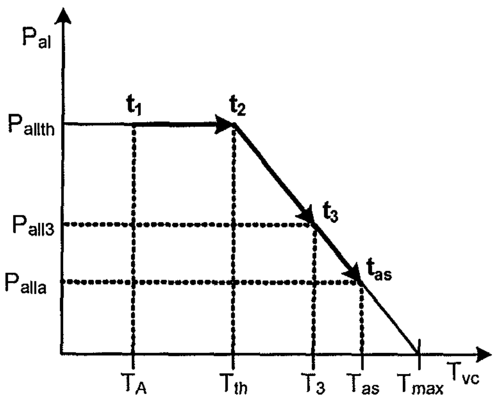
Figure 8C:
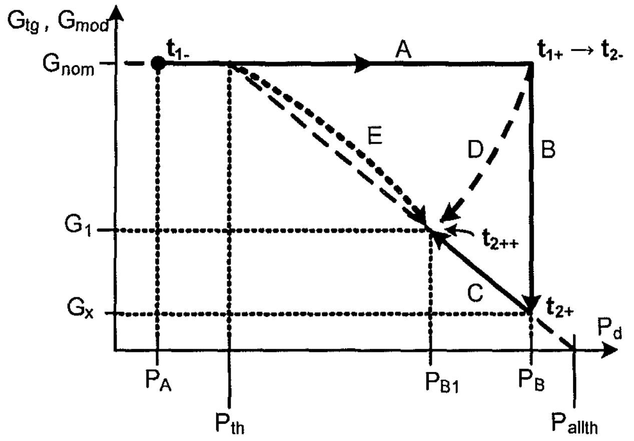
Figure 8D:
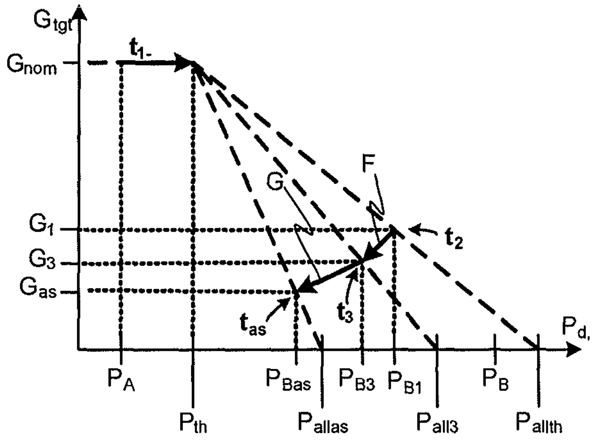

FIG. 8*a* illustrates how the input signal power $P_{in}$ varies over time and the resulting variation, over time, of the maximum allowed power $P_{all}$, gain control value $G_{mod}$, voice coil power dissipation $P_d$ and voice coil and magnet temperatures $T_{vc}$ and $T_m$. FIG. 8*b* illustrates the predefined variation of $P_{all}$ versus $T_{vc}$ used in this embodiment, i.e. the predefined transfer function between $P_{all}$ and $T_{vc}$. In this embodiment $P_{all}$ is equal to a value $P_{allth}$ for temperatures below a threshold temperature $T_{th}$ and above the threshold decreases linearly with temperature to zero at a temperature $T_{max}$. FIG. 8*c* illustrates how the target gain $G_{tgt}$ would vary according to the power $P_d$ as measured for the initial value of Pall. This is a constant value $G_{nom}$ until $P_d$ equals a defined threshold $P_{th}$, then reduces linearly to $P_{allth}$. For this discussion of operation, we assume the output actual gain control signal value $G_{mod}$ is essentially equal to $G_{tgt}$, i.e. we ignore any time delay involved. FIG. 8*d* illustrates the evolution of the $G_{tgt}$–$P_d$ characteristic over time as the voice coil temperature and hence $P_{all}$ changes. As $T_{vc}$ rises over time and so $P_{all}$ decreases, the second segment of the curve intercepts the $P_d$ axis at lower values of $P_d$ and thus its slope increases.

Like the discussion above in relation to FIG. 2 it is assumed that the system is initially in thermal steady state. As illustrated in FIG. 8*a*, initially the input digital signal corresponds to an input power $P_{in}$ of level $P_{IA}$. This corresponds to a power level $P_A$ being dissipated in the voice coil. The temperature of the voice coil is at a steady-state temperature $T_{VC0}$ and the magnet is at a steady-state temperature $T_{m0}$. As the temperature of the voice coil is relatively low, well below the maximum operating temperature $T_{max}$ for the voice coil, and below the threshold temperature $T_{th}$ the allowable power threshold $P_{all}$ an is at the relatively high fixed value $P_{allth}$ and the resulting gain control signal $G_{mod}$ value is at the nominal value $G_{nom}$.

At time $t_1$, the input signal power level increases to $P_{IB}$, corresponding nominally to an output power $P_B$. At this time the voice coil temperature remains below the threshold $T_{th}$ and thus the allowed power $P_{all}$ remains at $P_{allth}$, as can be seen from FIG. 8*b*.

At t1 the dissipated power increases to $P_B$, which is above the power threshold $P_{th}$. However, in this embodiment gain calculation block (implementing the $G_{tgt}$ vs $P_d$ characteristic) also receives the signal $T_{vc}$ representing the voice coil temperature, and is configured not to alter the gain from $G_{nom}$ until $T_{vc}$ exceeds the same temperature threshold temperature $T_{th}$. Thus as can be seen in FIG. 8*c*, despite the output power exceeding the threshold $P_{th}$, no gain reduction is applied at first (for segment A), so the output power $P_d$ remains at its increased level $P_B$ as illustrated in FIG. 8*a*.

The increased power dissipation thus leads to heating of the voice coil. At time $t_2$, $T_{vc}$ reaches the temperature threshold $T_{th}$. At this point the gain calculation block 502 is then allowed to reduce the target gain $G_{tgt}$ to that value $G_x$ appropriate for a power dissipation $P_B$ (illustrated by segment B on FIG. 8*c*). The gain control block 503 may control the timing and rate of change of this gain to reduce or avoid audible artefacts, but this is not visible on the long time scale of FIG. 8*a*.

This gain reduction may take a non-zero time to propagate through any amplifier circuitry to actually decrease the power dissipation, but then the decreased power dissipation makes a higher gain permissible. In a short time (illustrated by segment C of FIG. 8*c*) operating conditions converge to an equilibrium value of gain control $G_1$ and a (reduced) power dissipation $P_{B1}$. It should be noted that the operation illustrated by segments B and C happens relatively rapidly, and thus no significant change in temperature occurs during this period, so $P_{all}$ remains unchanged and equal to $P_{allth}$. In practice the power measurement and gain control may occur faster than the signal level variation, resulting in a trajectory more like dashed segment D.

It should be appreciated that in some other embodiments, the gain control block 502 may not suppress the initial gain change, so the gain and output power may drop and settle to this equilibrium condition at $t_1$ rather than $t_2$, possibly via a trajectory more like dotted curve E. This causes gain modulation of the signal to occur earlier, but at the same time as the step increase in input signal power, so the potential audio artefacts may be easier to manage.

Returning to FIG. 8*a*, as mentioned above at time $t_1$ the change in $P_{in}$ leads to an increase in the power dissipated in the voice coil to a value $P_B$ which leads to increased heating (relative to $P_A$) of the voice coil. Thus the voice coil temperature rises within a few voice coil thermal time constants $T_{vc}$, to a new value $T_{vc1}$, increased by $R_{thvcm}.(P_B-P_A)$.

Note that on the timescales of FIG. 8*a* this temperature rise can be seen a sudden increase in temperature. For this example, we assume that $T_{vc1}$ is less than $T_{th}$, so there is no immediate change in the gain control characteristic: the gain remains at its nominal value $G_{nom}$.

The magnet temperature does not immediately change at $t_1$, but slowly ramps up in temperature. The voice coil dissipates a constant power $P_B$, some of which serves to continue increasing the voice coil temperature (i.e. charging the voice coil thermal capacitance) but because of the temperature difference now established between the voice coil and the magnet, most of the power dissipated now flows into the magnet, which rises in temperature with roughly an exponential $1-\exp(-t/T_m)$ relationship. Throughout this period from $t_1$ to $t_2$ the voice coil temperature is also rising with approximately a parallel relationship towards an asymptote $T_{as12}$.

As discussed above, at $t_2$ the voice coil temperature reaches the threshold temperature $T_{th}$ and the gain is reduced quickly, to settle to a reduced value $G_1$ which corresponds to a dissipated power $P_{B1}$. This is less than the power $P_B$ that was dissipated before the gain reduction but still leads to a continued rise in temperature of the voice coil, albeit at a reduced rate.

Reaching the threshold temperature at time $t_2$, which in this example is also the threshold temperature of the $P_{all}$–$T_{vc}$ characteristic (see FIG. 8*b*), thus means that $P_{all}$ starts to decrease with increasing temperature. Thus the $P_{all}$ intercept of the $G_{mod}$–$P_d$ characteristic also starts to decrease and the sloping segment of the $G_{mod}$–$P_d$ characteristic starts to move, as illustrated in FIG. 8*d*. Thus, as the temperature of the voice coil increases the permissible gain at the power $P_{B1}$ becomes lower. However, as described above with respect to FIG. 8*c*, the application of the further reduced gain itself serves to decrease the actual power dissipated, the system follows the trajectory shown illustrated by segments F and G in FIG. 8*d*, with the applied gain and the power dissipated both simultaneously reducing over time. For instance at time $t_3$, the gain is reduced to a value $G_3$ (segment F) and the power reduced to a consistent value $P_{B3}$.

The decreasing power dissipated reduces (tracking with a delay only of the order of $T_{vc}$) power transfer to the magnet and hence the temperature differential with respect to the magnet. As the power received by the magnet reduces, the rate of increase of magnet temperature starts to reduce proportionately and the temperature asymptote to which the magnet temperature curve is aiming also starts to reduce. Thus the temperature asymptote to which $T_{vc}$ is aiming progressively also reduces over time. The curve for an arbitrary intermediate time $t=t_3$ is shown in FIG. 8*a*, aiming at an asymptotic value $T_{as3}$.

Eventually the system converges to a steady state voice coil temperature asymptote $T_{as}$ where the temperature increase above ambient $T_{as}-T_a$ is consistent, given the thermal resistances, with a modulated gain $G_{as}$ and output power dissipation $P_{Bas}$. i.e.

$$T_{as}-T_a=(R_{thvcm}+Rt_{hma})\cdot(G_{as}/G_{nom})^2\cdot P_{Bas}$$

(Note the square term in gain, since gain is defined as voltage gain not power gain). Segment G in FIG. 8*d* illustrates the system trajectory reaching this gain level at a time $t_{as}$.

As illustrated in FIGS. 6, 7*a*, 7*b*, various possible shapes of $P_{all}$ vs $T_{vc}$ and $G_{tgt}$ vs $P_d$ characteristic are possible, and there is also freedom in choosing values for $T_{th}$, $P_{allth}$ and $P_{th}$. Generally, steeper or more convex curves will allow more power to be maintained for longer, but once the limit is reached, the modulation of the gain has to be more rapid to avoid overshooting $T_{max}$. In the limit, the action would become a sudden turn-off, similar to an amplifier thermal shutdown, which is undesirable. In some embodiments (for instance, ones similar to the one described above) $P_{allth}$ may be defined as that power, if maintained, to raise the coil temperature from some $T_{th}$ to $T_{max}$ in a few seconds, of the order of a voice coil time constant. This will lead to worst case gain changes in use spanning over time spans of this order. However, even if $P_{allth}$ were chosen much higher (or the thermal characteristics of one individual loudspeaker were much more resistive than typical) since Pall and hence Gtgt are controlled to be at least near zero at $T=T_{max}$, the system would still be controlled to ensure that Tvc never exceed Tmax, so in some sense the system design will "fail safe" even if non-optimum parameters (except for $T_{max}$) are applied.

Figure 9:
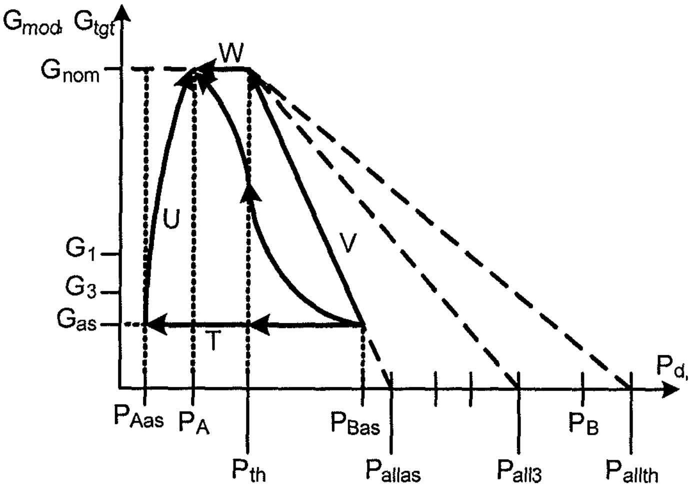
FIG. 9 illustrates how the gain may change with indication of power dissipation in response to a decrease in input power level.

Operation of this embodiment in the opposite scenario, when input equivalent power steps down from $P_{IB}$ to $P_{IA}$ will be now described with reference to FIG. 9. FIG. 9 illustrates various possible trajectories overlaid on the same $G_{tgt}$–$P_d$ characteristics of FIG. 8*d*.

Assuming the input power has been $P_{IB}$ for a long time, the gain will have stabilised to $G_{as}$ and the output power stabilised at $P_{Bas}$ as described above.

If the input signal power now steps down, then the output power will decrease. Assuming that the step change in signal is faster than the power detection circuitry and gain control logic, then the actual output power will actually decrease to $P_A \cdot (G_{as}/G_{nom})_2$ as illustrated by trajectory segment T in FIG. 9. The power detection block will then generate a corresponding low value of estimated output power. This is less than $P_A$ and thus less than $P_{th}$ and so the gain control block will react by increasing the gain back up to Gnom as illustrated by trajectory segment U.

On the other hand, if the input power level ramp is slower than the reaction time of the power detection and gain control circuitry, while still substantially faster than the voice coil thermal time constant, then the gain trajectory will follow segments V and W of the $G_{tgt}$–$P_d$ characteristic relevant to the present voice coil temperature $T_{as}$.

In either case, the gain is rapidly restored to $G_{nom}$ and the full requested output power $P_A$ is dissipated by the speaker, without waiting for any reduction in voice coil temperature.

Thus embodiments such as described above can support output signals with average long-term power up to $P_{allth}$, but with much greater short term peaks. There is no need for any precise characterisation of the thermal impedances of the loudspeaker components. Embodiments can be implemented economically using dedicated hardware circuitry and/or in software with low processing load. Many of the components utilised in embodiments may already be present for some other reason e.g. excursion limiting, and thus implementing an embodiment may have little impact in terms of cost and size implications compared with conventional designs.

Since an indication of the actual temperature is used, rather than some modelled value based on drive voltage and some thermal model, and since a signal representing the actual voice coil power dissipation is used based on measured drive voltage and coil current rather than relying on a measure of the input signal voltage and some assumed speaker impedance, embodiments of the invention can be designed with less margin for tolerances in the system. Thus, for example, the signal level up to which the gain is unchanged may be greater compared to a conventional design, and embodiments of the invention may behave better in extreme conditions, for example excessive ambient temperature.

Figure 10A:
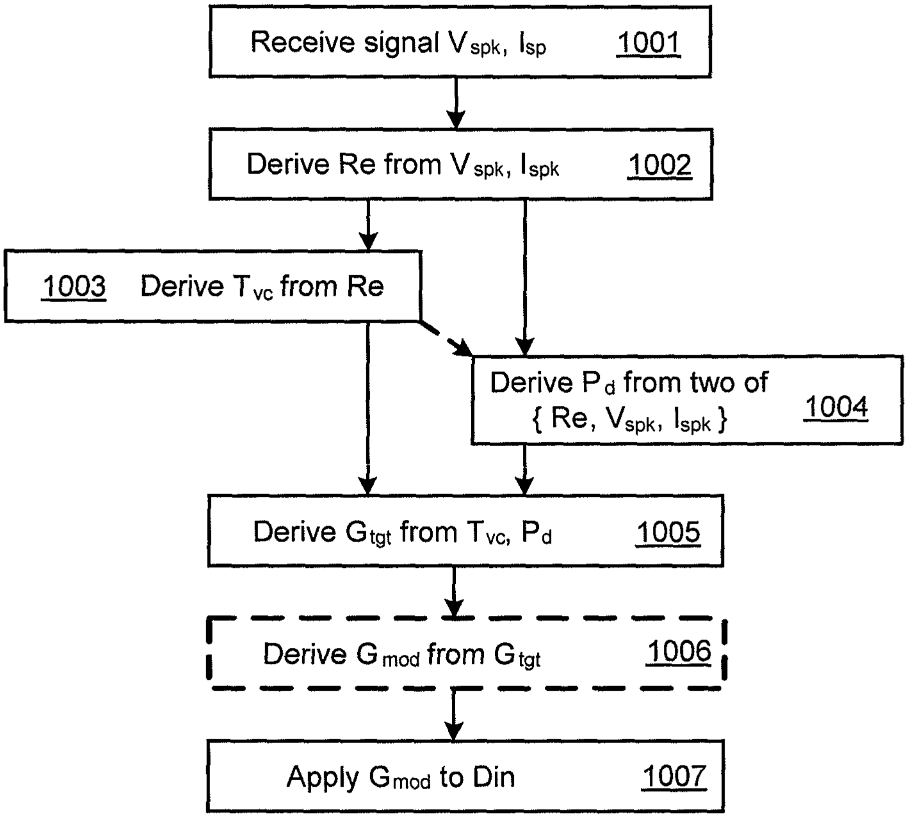
FIGS. 10*a* and 10*b* illustrate flowcharts of methods of embodiments of the invention.

FIGS. 10*a* shows a flow diagram illustrating the general method implemented by some embodiments of the invention such as described above. At step 1001 a loudspeaker protection control module receives signals $V_{spk}$ and $I_{spk}$ indicative of the monitored voice coil drive voltage $V_{spka}$ and voice coil current $I_{spka}$. The loudspeaker protection control module 306, at step 1002, derives an indication or estimate of the resistance voice coil resistance Re. At step 1003 an estimate $T_{vc}$ of the voice coil temperature is derived from the estimated voice coil resistance Re. At step 1004 an estimate $P_d$ of the present power dissipation of the loudspeaker, is derived from the indicative voltage and current signals $V_{spk}$ and $I_{spk}$ (or optionally from at least one of these signals and also the estimated voice coil resistance Re). A target gain control value may then be derived (step 1005) based on the voice coil power dissipation estimate $P_d$ and the voice coil temperature estimate $T_{vc}$. This target gain control value may be used directly as a gain control signal or optionally, at step 1006 additional processing may derive a gain control signal $G_{mod}$. The gain control signal may then be applied to the input signal (step 1007).

Figure 10B:
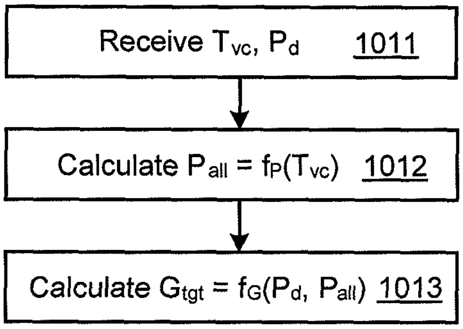

FIG. 10*b* shows a flow chart illustrating some of the processing that may be applied in calculating the target gain. At step 1011 the voice coil power dissipation estimate $P_d$ and the voice coil temperature estimate $T_{vc}$ are received. At step 1012 an allowed maximum power $P_{all}$ is derived based on a defined function $f_p(T_{vc})$. The allowed power $P_{all}$ is then used together with the voice coil power dissipation estimate $P_d$ to derive a target gain $G_{tgt}$.

Figure 11:
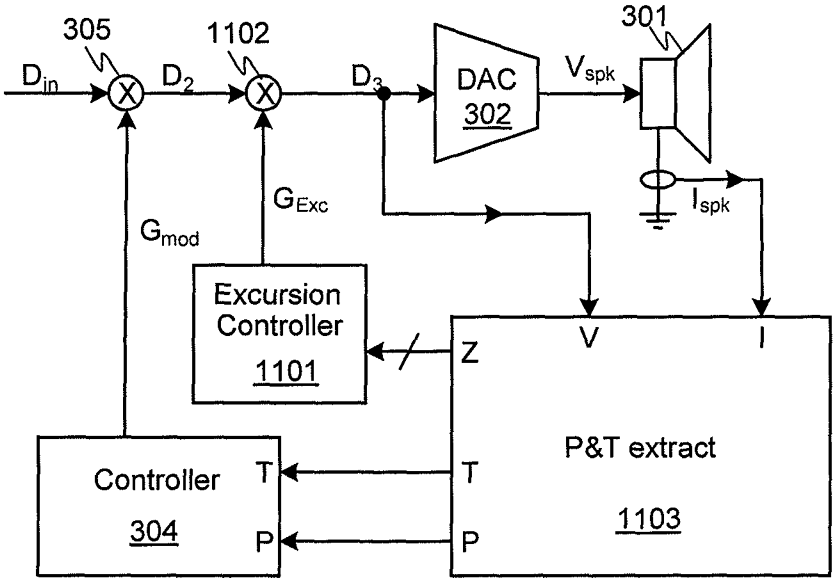
FIG. 11 illustrates a further embodiment of the invention.

As mentioned above in some applications it may be desirable to determine an indication of the loudspeaker voice coil resistance for other reasons, for example for limiting the excursion of the loudspeaker. Thus an impedance extraction block 402 such as described with respect to FIG. 4 may be shared with other elements of speaker protection circuitry. FIG. 11 illustrates an embodiment of the invention where similar components to those described above are identified using the same reference numerals but where the protection module 306 also comprises an excursion controller 1101 for controlling an additional gain element 1102 in the forward signal path.

A power and temperature extraction block 1103 receives an indication of the voice coil current and the drive signal voltage (conveniently receiving the digital input signal input to the DAC output stage 302) as described previously. This block will determine, i.e.

calculate, an estimate of the coil resistance as described above and determined power and temperature estimates. The power and temperature estimates are provided to thermal protection controller 304 to generate a gain modulation signal $G_{mod}$ as described previously. In this embodiment however an impedance extraction block of the power and temperature extraction block 1103 also extracts other impedance parameters of the voice coil for use in excursion limiting circuitry. It will be appreciated that coil impedance varies depending on temperature and on its position with respect to the magnet etc. Excursion controller therefore receives an indication of the coil impedance and determines an appropriate gain to be applied to the audio signal by gain element 1102 to limit the excursion of the loudspeaker to within safe bounds.

It would of course be possible to integrate excursion controller 1102 and thermal protection controller 304 in a single functional block and in some embodiments a single gain control signal may be produced and used to control a single gain element.

Embodiments have been described above in relation to a protection module for one output speaker. Other embodiments may comprise a protection module for a plurality of output speakers, which may all receive the same input signal or in some embodiment there may be a plurality of different input signals. The protection module be configured to treat each input signal as an independent channel, or gains may be ganged, so that all gains are reduced together, based on the worst case channel. Since actual output powers and coil temperatures are used, there is no need to assume ultra-safe values for thermal time constants etc. so less margin is needed, and each speaker can drive closer to its safe operating limits. For example if one speaker has poor thermal resistance, it would only be necessary to limit the input signals if that particular speaker is receiving a large signal.

Embodiments of the invention therefore relate to speaker protection circuitry for thermal protection of a loudspeaker, in particular to limit the voice coil temperature within safe limits by modulating the gain of the drive signal when required. In embodiments the circuitry calculates, i.e. determines, both an estimate of the power being dissipated in the loudspeaker and the present voice coil temperature to determine an acceptable power limit and reduces the gain of the drive signal based on the relative level of present power dissipation and the acceptable power limit.

Figure 12:
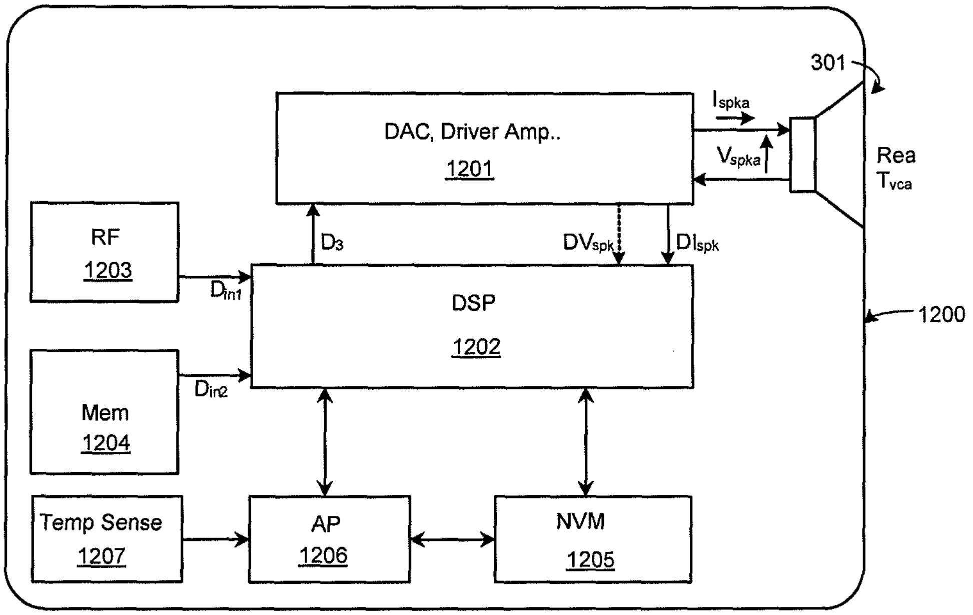
FIG. 12 illustrates an electronic device having a speaker protection module according to an embodiment of the invention.

Such speaker protection circuitry may be implemented in an electronic apparatus or device 1200 as illustrated in FIG. 12, for example a mobile phone. This device comprises a loudspeaker 301 which is driven from a driver circuit block 1201, which forms at least part of the signal processing chain 300. The driver circuit block 1201 receives a digital audio signal $D_3$ and delivers a resultant voltage $V_{spka}$ across the speaker.

This driver circuit block 1201 may comprise a DAC (possibly oversampled e.g. delta-sigma) and analog amplifier powerful enough to drive the impedance of the speaker. Alternatively it may comprise a Class D amplifier, either half-bridge or full-bridge, with an analog input from a DAC, or possibly an all-digital Class D modulator. The driver signal processing chain may also possibly include analog signal processing.

The speaker current $I_{spka}$ is monitored to provide a signal representative of this current. An analog current sense signal may be generated by a sense resistor which may be local to the speaker (possibly buffered locally) or co-located with the amplifier. The amplifier may be inside the speaker package or may be a more remote power amplifier, either discrete or embedded in a more complex codec. As an alternative to a sense resistor the voltage across a MOS output transistor may be sensed to measure the current. Whilst an analog signal for the speaker current could be provided, in some embodiments it may be preferred to provide a digital signal $DI_{spk}$ indicative of the sensed current. The sense buffer/digitising circuitry may therefore be provided as part of the local speaker driver chip 1201. Note that where a sense resistor or the like is used for current monitoring there may be a need for some room-temperature electrical calibration of the temperature-sense resistor. Such calibration would however be rapid, of the order of milliseconds and such calibration does not require the long time constants associated with trying to determine thermal resistance from temperature versus power measurements.

The digital speaker current signal $DI_{spk}$ is provided along with a digital signal $DV_{spk}$ representative of $V_{spka}$. Where the driver circuit 1201 includes analog processing the driver circuit may include an ADC to deliver the signal $DV_{spk}$, but in many cases $D_3$ will already be an adequate indicative signal.

A digital signal processing (DSP) 1202 block implements the speaker protection control module. The DSP block 1202 may receive a digital input audio signal $D_{in}$ intended for the speaker 301. This could for example be an audio signal $D_{in1}$ received from an interface 1203, for instance an RF radio/wireless interface or modem which could for example be received audio for a voice/video call and/or streaming media. At other times the input could be an audio signal $D_{in2}$ which may be received from some data storage 1204, for instance disk storage, either mechanical or solid-state, or some other semiconductor memory. This storage may be a permanent part of device 1200 or may be attachable storage such as a memory card or USB stick or suchlike. The DSP 1202 includes a gain stage to apply gain to the input signal $D_{in}$ and also possibly further DSP or multiplier blocks to perform further signal processing to generate the digital signal $D_3$ supplied to the driver block 1201.

The speaker protection control module may be implemented by software code running on the DSP 1202.

This software code may be stored in the device as firmware on some non-volatile memory e.g. EEPROM (to preserve program data when the battery becomes discharged or is removed for replacement.

The relevant software for running the loudspeaker protection module may be loaded into the DSP on power-up, which could be for example awaking of the device 1200 from a standby mode, or on start-up of the speaker driver function, e.g. on receipt of user command to start outputting sound via the loudspeaker.

A separate processor, for example an applications processor, AP, or processor core 1206 may control this start-up.

In some applications at least some audio data (e.g. ring tone, pre-recorded voice alert or the like) may be provided from the NVM 1205, either directly or via processor AP 1206.

As mentioned previously in some embodiments the speaker protection control module may determine the resistance of the voice coil based on a reference voice coil resistance which could be determined on device start-up. In such embodiments the ambient temperature may be sensed by a temperature sensor 1207 in order to infer the voice coil temperature on start-up. In some devices a temperature sensor may be present for other reasons anyway and may be used for this purpose, for example providing ambient temperature data to the applications processor 1206 as illustrated. In other embodiments however the ambient temperature data could be provided directly to the DSP 1202. Such an ambient temperature sensor may additionally or alternatively be used in calibrating any sense resistor provided for monitoring the current of the voice coil.

It will of course be appreciated that the various blocks illustrated in FIG. 12 or parts thereof may be co-integrated with the other blocks or parts thereof or with other functions of the host device. For example the DSP 1202 and driver block 1201 may be co-integrated into an Audio Hub.

The skilled person will thus recognise that some aspects of the above-described apparatus and methods, for example the calculations performed by the processor may be embodied as processor control code, for example on a non-volatile carrier medium such as a disk, CD- or DVD-ROM, programmed memory such as read only memory (Firmware), or on a data carrier such as an optical or electrical signal carrier. For many applications embodiments of the invention will be implemented on a DSP (Digital Signal Processor), ASIC (Application Specific Integrated Circuit) or FPGA (Field Programmable Gate Array). Thus the code may comprise conventional program code or microcode or, for example code for setting up or controlling an ASIC or FPGA. The code may also comprise code for dynamically configuring re-configurable apparatus such as re-programmable logic gate arrays. Similarly the code may comprise code for a hardware description language such as Verilog™ or VHDL (Very high speed integrated circuit Hardware Description Language). As the skilled person will appreciate, the code may be distributed between a plurality of coupled components in communication with one another. Where appropriate, the embodiments may also be implemented using code running on a field-(re)programmable analog array or similar device in order to configure analog hardware Embodiments of the invention may be arranged as part of an audio processing circuit, for instance an audio circuit which may be provided in a host device. A circuit according to an embodiment of the present invention may be implemented as an integrated circuit. One or more loudspeakers may be connected to the integrated circuit in use.

Embodiments may be implemented in a host device, especially a portable and/or battery powered host device such as a mobile telephone, an audio player, a video player, a PDA, a mobile computing platform such as a laptop computer or tablet and/or a games device for example. Embodiments of the invention may also be implemented wholly or partially in accessories attachable to a host device, for example in active speakers or headsets or the like.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope. Terms such as amplify or gain include possibly applying a scaling factor of less than unity to a signal.

What is claimed is:

1. A method of thermal protection of a voice coil of a loudspeaker comprising:

driving said loudspeaker based on an input signal received at an input terminal monitoring both a voltage applied to said voice coil and a current flowing through said voice coil;

determining both an estimate of temperature of said voice coil and an estimate of power dissipation in said voice coil based on said monitored voltage and current, wherein at least said estimate of temperature is determined based on an estimate of resistance of said voice coil and wherein said estimate of voice coil resistance is determined based on said monitored voltage and current; and generating a gain control signal for modulating a gain applied to said input signal within a signal path between said input terminal and said loudspeaker for thermal protection, wherein said gain control signal is generated as a function of both said estimate of temperature of said voice coil and said estimate of power dissipation in said voice coil.

2. A thermal protection system for a loudspeaker comprising:

at least one input for receiving a first signal indicative of voltage applied to the voice coil of said loudspeaker and a second signal indicative of current flowing in said voice coil;

a temperature and power estimation module configured to determine an estimate of temperature of the voice coil and an estimate of power dissipation in the voice coil based on said first and second signals; wherein at least said estimate of temperature is based on an estimate of resistance of said voice coil which is determined based on said first and second signals;

a gain controller configured to generate a gain control signal for modulating the gain of a signal processing chain driving said loudspeaker, wherein said gain control signal is generated as a function of both said estimate of temperature of said voice coil and said estimate of power dissipation in the voice coil.

3. A system as claimed in claim 2 wherein said temperature and power estimation module is configured to determine said estimate of voice coil resistance based on:

the difference between the value of said estimated voice coil resistance and a reference resistance value at a known temperature; and a temperature coefficient for the loudspeaker voice coil.

4. A system as claimed in claim 2 wherein said temperature and power estimation module is configured to determine said estimate of power dissipation based on said estimated voice coil resistance and said monitored current.

5. A system as claimed in claim 2 wherein said gain controlled is configured to apply a first transfer function to said estimate of voice coil temperature to determine an allowed power limit, wherein the value of said gain control signal is a function of said allowed power limit.

6. A system as claimed in claim 5 wherein said first transfer function provides a first constant value of said allowed power limit for any voice coil temperature below a first threshold.

7. A system as claimed in claim 6 wherein said first constant value of allowed power limit is configurable in use.

8. A system as claimed in claim 6 wherein said first transfer function is defined such that for any voice coil temperature below a first threshold no allowed power limit is applied.

9. A system as claimed in claim 6 wherein said first transfer function is defined such that for any voice coil temperature above a second temperature threshold the allowed power limit is a second constant value.

10. A system as claimed in claim 6 wherein, for at least part of the expected range of voice coil temperature said first transfer function is a linear interpolation from a first value to a second value.

11. A system as claimed in claim 6 wherein, for at least part of the expected range of voice coil temperature said first transfer function describes, in a plot of allowed power against voice coil temperature, a convex curve of from a first value to a second value.

12. A system as claimed in claim 6 wherein said gain controlled is configured to apply a second transfer function to said estimate of power dissipation to determine a gain control value, wherein the second transfer function is a function of said allowed power limit and wherein the gain control signal is based on said gain control value.

13. A system as claimed in claim 12 wherein said second transfer function provides a first constant value for the gain control value for any power dissipation below a first threshold.

14. A system as claimed in claim 13 wherein said first constant value for the gain control value corresponds to a minimum gain modulation being applied to the input signal for thermal protection.

15. A system as claimed in claim 13 wherein said first constant value for the gain control value is configurable in use.

16. A system as claimed in claim 12 wherein said second transfer function is defined such that for power dissipation below a first threshold gain modulation for thermal protection is applied.

17. A system as claimed in claim 12 wherein said second transfer function is defined such that for any power dissipation above the allowed power limit, the gain control value is a second constant value.

18. A system as claimed in claim 12 wherein, for at least part of the expected range of power dissipation said second transfer function is a linear interpolation from a first value to a second value, wherein at least said second value depends on said allowed power limit.

19. A system as claimed in claim 12 wherein, for at least part of the expected range of power dissipation said second transfer function describes, in a plot of gain control value against power dissipation, a convex curve of from a first value to a second value, wherein at least said second value depends on said allowed power limit.

20. A system as claimed in claim 12 wherein said gain controller is configured to apply time domain processing to said gain control value wherein said time domain processing comprises applying at least one of an attack time constant and a decay time constant to said gain control value to generate said gain control signal.

21. A system as claimed in claim 2 wherein said gain controller is configured so as to apply no gain modulation for thermal protection if the estimated voice coil temperature is below a gain modulation temperature threshold.

22. A system as claimed in claim 2 wherein said gain controller is configured to time the application of any gain changes to synchronise with zero crossings in the input signal.

23. A system as claimed in claim 2 wherein said gain controller is configured such that the maximum frequency of gain changes applied is maintained below a predetermined limit.

24. A system as claimed in claim 2 comprising a gain element for applying a gain to the input signal, said gain element being controlled by said gain controller.

25. A system as claimed in claim 24 wherein said gain controller controls the gain of said gain element based on said gain control signal and at least one other gain setting.

26. A system as claimed in claim 25 wherein said at least one other gain setting is one of: a user controlled volume setting; a gain control setting for excursion limiting.

27. A system as claimed in claim 2 comprising a signal processing circuit for driving said loudspeaker.

28. A system as claimed in claim 27 comprising a loudspeaker.

29. An electronic apparatus comprising a system as claimed in claim 2.

30. An electronic apparatus as claimed in claim 29 wherein said apparatus is at least one of: a portable device; a battery power device; a computing device; a communications device; a gaming device; a mobile telephone; a personal media player; a laptop, tablet or notebook computing device.

31. Software code stored on a non-transitory storage medium, which when run on a suitable processor provides a gain control signal for controlling a gain applied upstream of a loudspeaker for thermal protection, said code comprising instructions to:

accept signals representing a monitored voltage and a monitored current of a voice coil of a loudspeaker determine both an estimate of temperature of said voice coil and an estimate of power dissipation in said voice coil based on said monitored voltage and current, wherein at least said estimate of temperature is determined based on an estimate of resistance of said voice coil and wherein said estimate of voice coil resistance is determined based on said monitored voltage and current; and generate said gain control signal as a function of both said estimate of temperature of said voice coil and said estimate of power dissipation in said voice coil.

32. An electronic device comprising memory containing software code as claimed in claim 31 and a suitable processor for running said code.

33. Loudspeaker protection circuitry, for providing a gain control signal for controlling the gain applied to an input signal to provide a drive voltage into a loudspeaker voice coil, comprising a controller configured to:

receive signals indicative of the voice coil current and drive voltage;

calculate from said indicative signals, an estimate of the present voice coil temperature and an estimate of the power dissipation of the voice coil, wherein at least said estimate of voice coil temperature is based on an estimate of the present voice coil resistance which is determined from said indicative signals; and generate and output said gain control signal as a function of both the estimate of voice coil temperature and power dissipation.

* * * * *